United States Patent
Youn et al.

(10) Patent No.: US 7,777,272 B2
(45) Date of Patent: Aug. 17, 2010

(54) NON-VOLATILE MEMORY DEVICE AND SEMICONDUCTOR PACKAGE INCLUDING THE SAME

(75) Inventors: Sun-Pil Youn, Incheon (KR); Hyeong-Jun Kim, Seoul (KR); Jin-Tae Kang, Gyeonggi-do (KR); Young-Jae Joo, Gyeonggi-do (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 12/112,965

(22) Filed: Apr. 30, 2008

(65) Prior Publication Data

US 2008/0277720 A1    Nov. 13, 2008

(30) Foreign Application Priority Data

May 10, 2007    (KR) ...................... 10-2007-0045415

(51) Int. Cl.
  *H01L 29/792*    (2006.01)
  *H01L 29/78*    (2006.01)
  *H01L 21/8247*    (2006.01)

(52) U.S. Cl. .................. 257/324; 257/314; 257/288; 257/330; 257/E29.309; 257/E29.255; 257/E29.07; 257/E29.266; 257/E29.242; 438/156

(58) Field of Classification Search ............. 257/324, 257/314, 288, E29.309, 330, 22, E21.411, 257/E29.07, E29.266, E29.242, E29.255; 438/156; *H01L 21/8247, 29/792, 29/78*
See application file for complete search history.

(56) References Cited

U.S. PATENT DOCUMENTS 6,114,725 A * 9/2000 Furukawa et al. .......... 257/330
6,157,061 A * 12/2000 Kawata ...................... 257/316
6,842,370 B2    1/2005 Forbes
6,930,343 B2 * 8/2005 Choi et al. .................. 257/296
7,214,992 B1 * 5/2007 Strachan et al. ............. 257/401

(Continued)

FOREIGN PATENT DOCUMENTS

KR    2004-0043043    5/2004

(Continued)

OTHER PUBLICATIONS

English language abstract of Korean Publication No. 2004-0043043.

(Continued)

*Primary Examiner*—Lynne A Gurley
*Assistant Examiner*—Naima J Kearney
(74) *Attorney, Agent, or Firm*—Muir Patent Consulting, PLLC

(57) ABSTRACT

A non-volatile memory device which can be highly-integrated without a decrease in reliability, and a method of fabricating the same, are provided. In the non-volatile memory device, a first doped layer of a first conductivity type is disposed on a substrate. A semiconductor pillar of a second conductivity type opposite to the first conductivity type extends upward from the first doped layer. A first control gate electrode substantially surrounds a first sidewall of the semiconductor pillar. A second control gate electrode substantially surrounds a second sidewall of the semiconductor pillar and is separated from the first control gate electrode. A second doped layer of the first conductivity type is disposed on the semiconductor pillar.

21 Claims, 12 Drawing Sheets

U.S. PATENT DOCUMENTS

| | | | |
|---|---|---|---|
| 7,425,491 B2 * | 9/2008 | Forbes | 438/301 |
| 2005/0046002 A1 * | 3/2005 | Lee et al. | 257/678 |
| 2006/0040446 A1 * | 2/2006 | Hsieh | 438/257 |
| 2006/0197211 A1 * | 9/2006 | Miyata et al. | 257/686 |
| 2007/0057309 A1 | 3/2007 | Song et al. | |
| 2008/0093664 A1 * | 4/2008 | Yun et al. | 257/324 |

FOREIGN PATENT DOCUMENTS

KR  2005-0111951  11/2005

OTHER PUBLICATIONS

English language abstract of Korean Publication No. 2005-0111951.

* cited by examiner

NON-VOLATILE MEMORY DEVICE AND SEMICONDUCTOR PACKAGE INCLUDING THE SAME

CROSS-REFERENCE TO RELATED PATENT APPLICATION

This application claims priority under 35 USC §119 to Korean Patent Application No. 10-2007-0045415, filed on May 10, 2007 in the Korean Intellectual Property Office, the disclosure of which is incorporated herein in its entirety by reference.

BACKGROUND

1. Technical Field

This disclosure relates to a semiconductor device, and more particularly, to a non-volatile memory device for storing and reading data therefrom and a method of fabricating the same.

2. Description of the Related Art

Recent advances in high capacity mobile electronic devices, for example, digital cameras, MP3 players, and the like, have been substantial. However, there is still a demand for such electronic devices to have smaller size and higher storage capacity. Accordingly, non-volatile memory devices used for these electronic devices are required to have higher integration density, that is, higher storage capacity.

However, the increase of the integration density of non-volatile memory devices by fine pattern formation is restricted due to the limitation of processing technologies. As the integration density of conventional planar type non-volatile memory devices increases, performance deterioration due to a short channel effect can occur. Accordingly, high integration of planar type non-volatile memory devices can cause reliability deterioration.

Furthermore, as the integration density of conventional non-volatile memory devices increases, the volume of a charge storage layer decreases. Thus, the amount of charge which can be stored in the charge storage layer may decrease. Consequently, the reliability of a data program, in particular, the reliability of a multi-bit operation, may be reduced.

SUMMARY

The present invention provides a non-volatile memory device with high integration and high reliability. The present invention also provides a method of fabricating the non-volatile memory device. The present invention further provides a semiconductor package including the non-volatile memory device.

According to an aspect of the present invention, there is provided a non-volatile memory device. In the non-volatile memory device, a first doped layer of a first conductivity type is disposed on a substrate. A semiconductor pillar, of a second conductivity type opposite to the first conductivity type, extends upward from the first doped layer. A first control gate electrode substantially surrounds a first sidewall of the semiconductor pillar. A second control gate electrode substantially surrounds a second sidewall of the semiconductor pillar and is separated from the first control gate electrode. A second doped layer of the first conductivity type is disposed on the semiconductor pillar.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION

Figure 1:
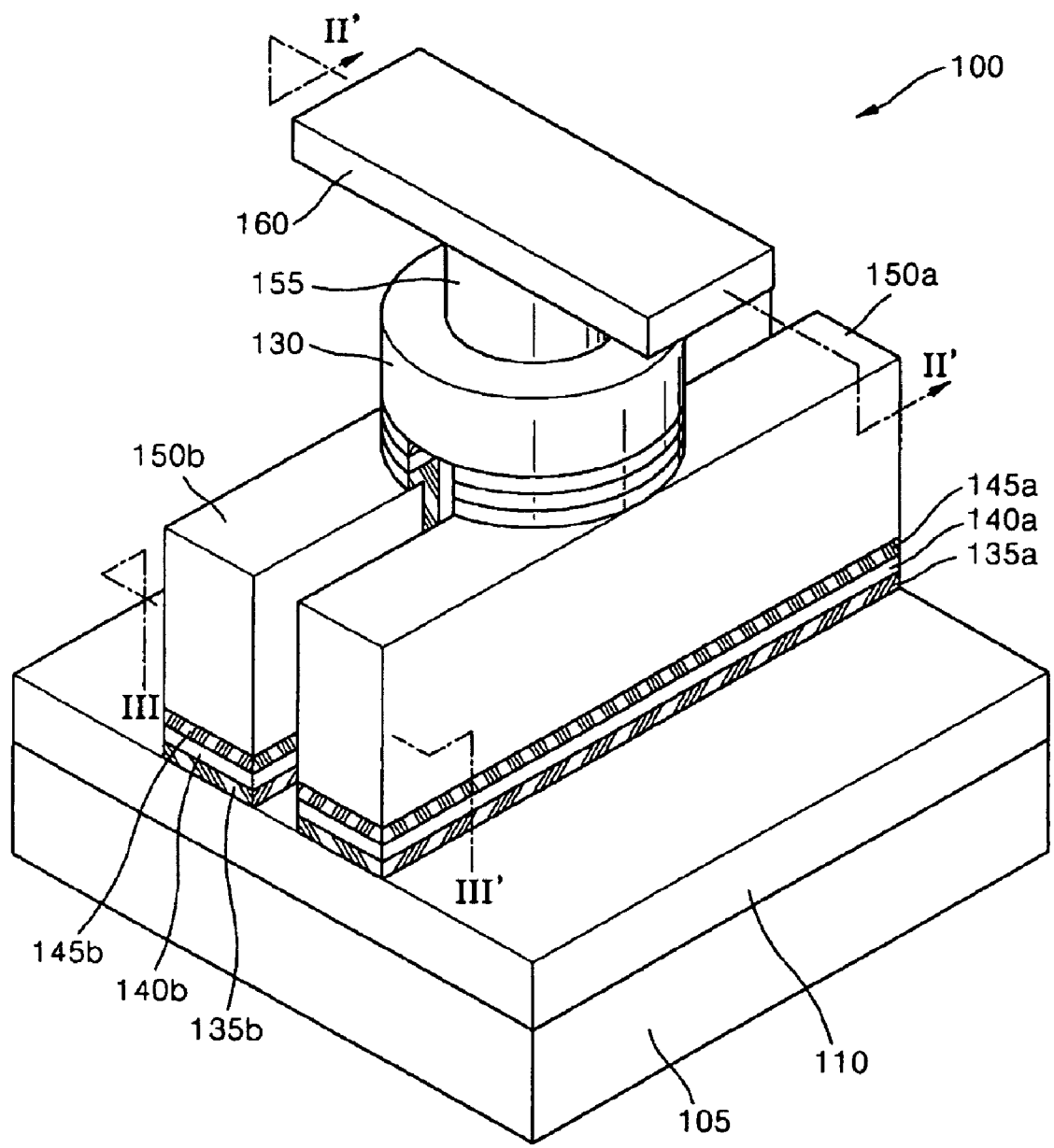
FIG. 1 is a perspective view illustrating a non-volatile memory device according to an embodiment of the present invention.

The present invention will now be described more fully hereinafter with reference to the accompanying drawings, in which preferred embodiments of the invention are shown. This invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the sizes of elements may be exaggerated for clarity.

Figure 2:
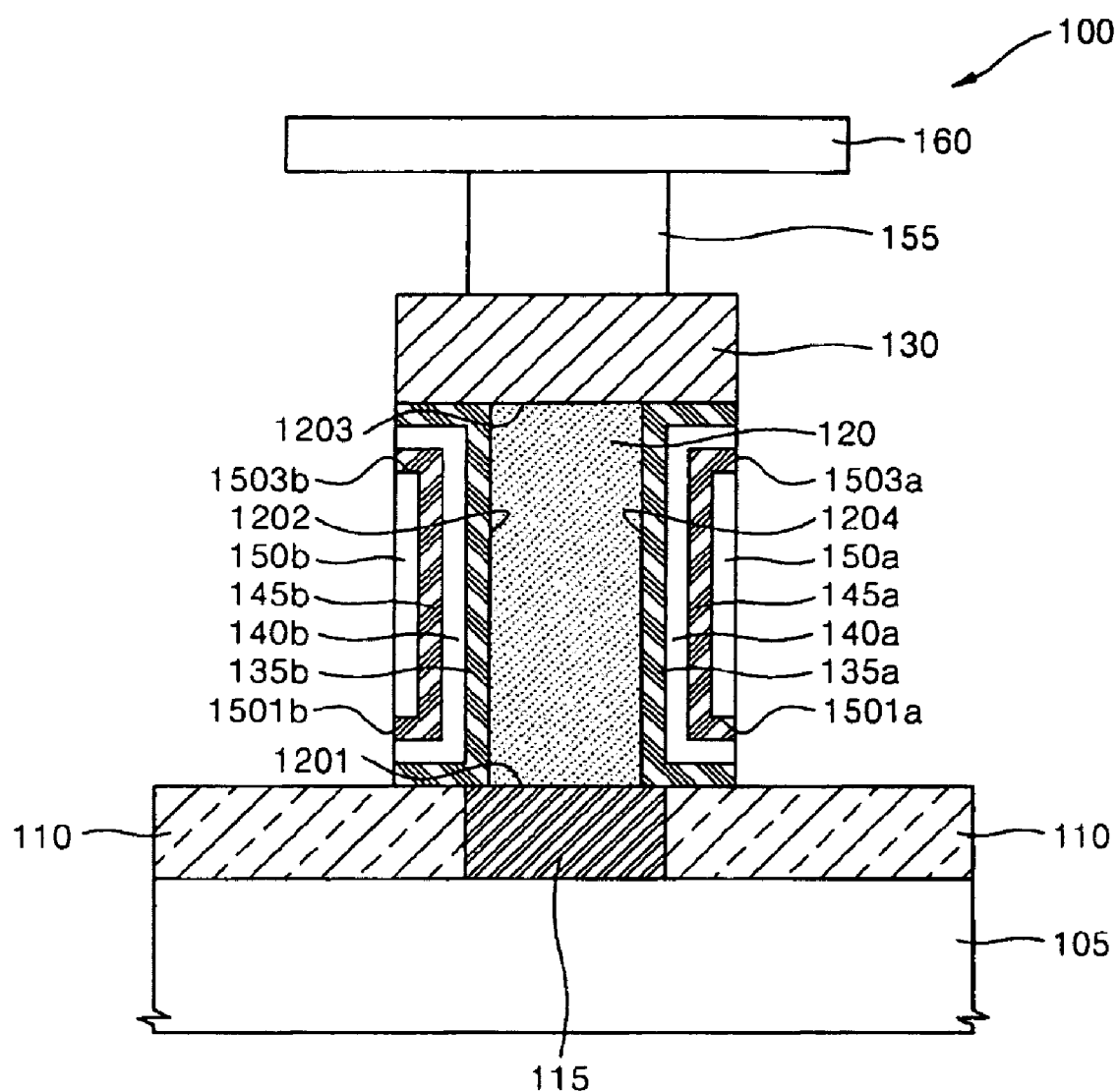
FIG. 2 is a cross-sectional view taken along line II-II' of the non-volatile memory device shown in FIG. 1.
Figure 3:
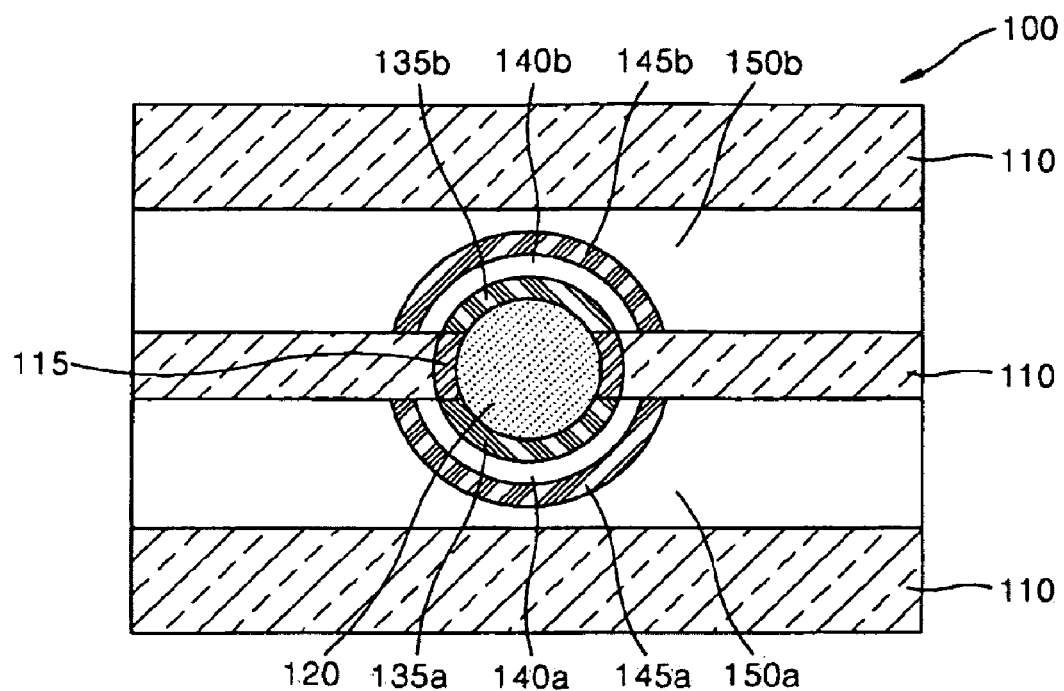
FIG. 3 is a cross-sectional view taken along line III-III' of the non-volatile memory device shown in FIG. 1.

FIG. 1 is a perspective view illustrating a non-volatile memory device 100 according to an embodiment of the present invention. FIG. 2 is a cross-sectional view taken along line II-II' of the non-volatile memory device 100 shown in FIG. 1. FIG. 3 is a cross-sectional view taken along line III-III' of the non-volatile memory device 100 shown in FIG. 1.

Referring to FIG. 1 through FIG. 3, a semiconductor pillar 120 is formed between a first doped layer 115 and a second doped layer 130. The first doped layer 115 and the second doped layer 130 may be of a first conductivity type, and the semiconductor pillar 120 may be of a second conductivity type opposite to the first conductivity type. For example, the first conductivity type and the second conductivity type may be selected from n type and p type conductivities. As a further example, the first doped layer 115 and the second doped layer 130 may be doped with the first conductivity type impurities in high concentration, and the semiconductor pillar 120 may be doped with the second conductivity type impurities in low concentration.

The first doped layer 115 and the second doped layer 130 may act as a source region or a drain region in the non-volatile memory device 100. The semiconductor pillar 120 can define a channel region (not shown), which is a conductive path for charges. Accordingly, the semiconductor pillar 120 may electrically connect the first doped layer 115 and the second doped layer 130 according to ON-OFF states of the non-volatile memory device 100.

According to an aspect of the present invention, the first doped layer 115 may be defined by doping with the first conductivity type impurities in high concentration a portion of a substrate 105. The substrate 105 is made of a semiconductor material such as silicon and may have a single crystalline structure. According to another aspect of the present invention, the first doped layer 115 may be provided as an epitaxial layer on the substrate 105. In this case, the first doped layer 115 is formed to match the crystal lattice of the substrate 105 and thus may have a single crystalline structure like the substrate 105.

A sidewall of the first doped layer 115 may be surrounded by a device isolation layer 110. For example, the device isolation layer 110 may include an oxide layer, a nitride layer, or a low-k dielectric layer. The low-k dielectric layer may be an insulating layer, which has a lower dielectric constant than the oxide layer.

The semiconductor pillar 120 may extend upward from the first doped layer 115. The semiconductor pillar 120 may include a semiconductor material. For example, the semiconductor material may include silicon, silicon-germanium, or germanium. The semiconductor pillar 120 may be substantially perpendicular to the substrate 105, but the present invention is not limited thereto. For example, the semiconductor pillar 120 may be inclined upward from the substrate 105 at a predetermined angle.

The semiconductor pillar 120 may have various forms. Preferably, the semiconductor pillar 120 may have a nano-wire structure made of a semiconductor material. The nano-wire has a diameter of a nanometer scale. The nano-wire structure may have a polygonal shape or a cylindrical form (as shown in FIG. 3). Furthermore, a diameter or width of the semiconductor pillar 120 may be substantially constant, but the present invention is not limited thereto. For example, the semiconductor pillar 120 may have a radial structure in which a diameter or width thereof increases toward the substrate 105.

When the semiconductor pillar 120 is provided as an epitaxial layer on the first doped layer 115, the semiconductor pillar 120 may include a bottom surface 1201, a top surface 1203, a first sidewall 1204 and a second sidewall 1202. The first sidewall 1204 and the second sidewall 1202 may face each other. For example, the first doped layer 115 may cover at least the center portion of the bottom surface 1201. The first doped layer 115 may cover substantially the entire bottom surface 1201 of the semiconductor pillar 120.

The second doped layer 130 may be provided as an epitaxial layer on the semiconductor pillar 120. Accordingly, the second doped layer 130, the semiconductor pillar 120, and the first doped layer 115 may have the same crystalline structure, for example a single crystalline structure. The second doped layer 130 may cover the top surface 1203 of the semiconductor pillar 120.

The second doped layer 130 may have a diameter or width greater than the semiconductor pillar 120 and the first doped layer 115. The direction of the widths may be parallel to the substrate 105. For example, the second doped layer 130 may have a radial structure so that a radius or width thereof increases in a direction from the top surface 1203 of the semiconductor pillar 120 toward the top surface of the second doped layer 130.

A first control gate electrode 150a may be disposed to surround the first sidewall 1204 of the semiconductor pillar 120, as exemplarily shown in FIG. 3. A second control gate electrode 150b may surround the second sidewall 1202 of the semiconductor pillar 120. The first control gate electrode 150a and the second control gate electrode 150b may be disposed above the substrate 105 and separated from each other. The first control gate electrode 150a includes a bottom surface 1501a and a top surface 1503a. The second control gate electrode 150b includes a bottom surface 1501b and a top surface 1503b. The first and second control gate electrodes 150a and 150b may be used as parts of word lines.

A first charge storage layer 140a may be interposed between the first control gate electrode 150a and the semiconductor pillar 120. The second charge storage layer 140b may be interposed between the second control gate electrode 150b and the semiconductor pillar 120. A first tunneling insulating layer 135a may be interposed between the semiconductor pillar 120 and the first charge storage layer 140a. A second tunneling insulating layer 135b may be interposed between the semiconductor pillar 120 and the second charge storage layer 140b. A first blocking insulating layer 145a may be interposed between the first charge storage layer 140a and the first control gate electrode 150a. A second blocking insulating layer 145b may be interposed between the second charge storage layer 140b and the second control gate electrode 150b.

According to some embodiments, the first tunneling insulating layer 135a, the first charge storage layer 140a and/or the first blocking insulating layer 145a may surround the first sidewall 1204 of the semiconductor pillar 120. Furthermore, the first tunneling insulating layer 135a, the first charge storage layer 140a and/or the first blocking insulating layer 145a may further extend substantially vertically with respect to a long axis of the semiconductor pillar 120 to cover the bottom surface 1501a and the top surface 1503a of the first control gate electrode 150a. However, the present invention is not limited thereto. Thus, a stacked structure of the first tunneling insulating layer 135a, the first charge storage layer 140a, and the first blocking insulating layer 145a may have different configurations such as an arc.

In the present embodiment, the first tunneling insulating layer 135a and the second tunneling insulating layer 135b may be separated from each other. Furthermore, the first blocking insulating layer 145a and the second blocking insulating layer 145b may be separated from each other. The first charge storage layer 140a and the second charge storage layer 140b may also be separated from each other.

In one embodiment, the first and second tunneling insulating layers 135a and 135b and the first and second blocking insulating layers 145a and 145b may include an oxide layer such as a silicon dioxide layer, a nitride layer such as a silicon nitride layer, or a high-k dielectric layer such as nitrided hafnium silicates (HfSiON). $HfO_2$ and HfSiO. The high-k dielectric layer may be an insulating layer with a higher dielectric constant than the oxide layer and the nitride layer. The first and second charge storage layers 140a and 140b may include materials capable of trapping charges. For example, the first and second charge storage layers 140a and 140b may be a nitride layer, charge-trapping dots, or nano-crystals. The dots and the nano-crystals may include conductive materials, for example, minute particles made of a metal or silicon.

A bit line electrode 160 may be electrically connected to the second doped layer 130 by using a contact plug 155. For example, the contact plug 155 may be disposed on the second doped layer 130, and the bit line electrode 160 may be disposed on the contact plug 155.

The non-volatile memory device 100 according to the present embodiment may be used for a data storage medium. A data program operation may be performed by storing charges in the first charge storage layer 140a and/or the second charge storage layer 140b by tunneling or using channel hot electron injection (CHEI). An erasing operation may be performed to remove charges from the first charge storage layer 140a and/or the second charge storage layer 140b by tunneling.

The non-volatile memory device 100 can separate and store data in the first charge storage layer 140a and the second charge storage layer 140b by controlling the first and second control gate electrodes 150a, 150b. Accordingly, in the non-volatile memory device 100, a 2-bit operation can be performed using a single level cell (SLC) operation method, and furthermore, an operation of more than 2 bits can be performed using a multi level cell (MLC) operation method.

In the non-volatile memory device 100, channels, which are conductive path of charges, may be vertically formed along surfaces of the first and second sidewalls 1204 and 1202 of the semiconductor pillar 120. Therefore, by controlling a height of the semiconductor pillar 120, the lengths of the channels can easily be extended. Consequently, a short channel effect can be effectively reduced or minimized. However, by decreasing a diameter or width of the bottom surface 1201 of the semiconductor pillar 120, the integration density on the substrate 105 can be increased. Accordingly, the non-volatile memory device 100 according to the present embodiment of the invention overcomes the problems of a conventional planar type structure in which as the integration density increases, the short channel effect becomes worse.

Furthermore, by controlling a height of the semiconductor pillar 120, areas of the first and second charge storage layers 140a and 140b surrounding the semiconductor pillar 120 can be enlarged. As the areas of the first and second charge storage layers 140a, 140b are enlarged, an amount of stored charges can be increased. Accordingly, properties related to data programming and retention are improved, thereby improving the operational reliability of the non-volatile memory device 100. Furthermore, the reliability of a multi-bit operation in which data programming is performed by locally separating the first and second charge storage layers 140a and 140b can be improved.

Figure 4:
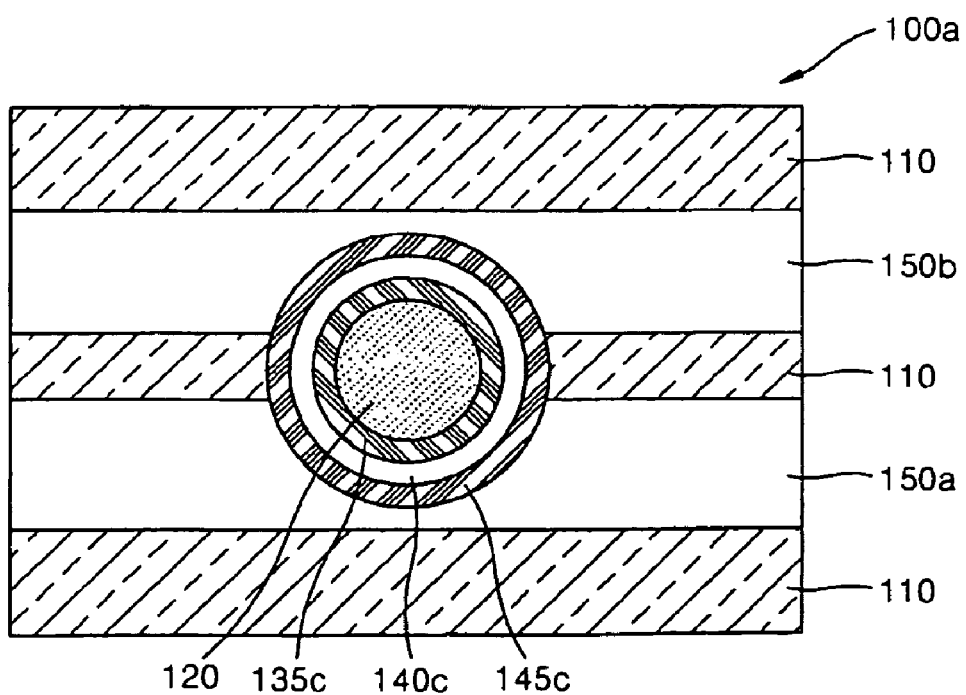
FIG. 4 is a cross-sectional view illustrating a non-volatile memory device according to another embodiment of the present invention.

FIG. 4 is a cross-sectional view illustrating a non-volatile memory device 100a according to another embodiment of the present invention. The non-volatile memory device 100a is a modified example of the non-volatile memory device 100 shown in FIGS. 1 through 3. Thus, repeated description of the elements described with respect to FIGS. 1 through 3 will be omitted.

Referring to FIG. 4, a tunneling insulating layer 135c may have a structure in which the first tunneling insulating layer 135a and the second tunneling insulating layer 135b of FIGS. 1 through 3 are connected to each other. A charge storage layer 140c may have a structure in which the first charge storage layer 140a and the second charge storage layer 140b of FIGS. 1 through 3 are connected to each other. Further, a blocking insulating layer 145c may have a structure in which the first blocking insulating layer 145a and the second blocking insulating layer 145b of FIGS. 1 through 3 are connected to each other. However, the first control gate electrode 150a and the second control gate electrode 150b may be separated from each other.

In the present embodiment, the charge storage layer 140c is used as a charge trap layer, and thus, stored charges can be segregated. Accordingly, the data state of the charge storage layer 140c on the first sidewall 1204 of the semiconductor pillar 120 can be controlled by using the first control gate electrode 150a, and the data state of the second charge storage layer 140b on the second sidewall 1202 can be controlled by using the second control gate electrode 150b. Thus, the non-volatile memory device 100a can operate in the same manner as the non-volatile memory device 100 described in FIGS. 1 through 3.

In another modification of the present embodiment, one or two of the tunneling insulating layer 135c, the charge storage layer 140c, and the blocking insulating layer 145c can be separated into two layers as shown in FIGS. 1 through 3.

FIG. 5 through FIG. 9, FIG. 11, FIG. 12 and FIG. 14 are cross-sectional views illustrating methods of fabricating a non-volatile memory device according to an embodiment of the present invention. FIG. 10 is a cross-sectional view taken along line X-X' of FIG. 9. FIG. 13 is a cross-sectional view taken along line XIII-XIII' of FIG. 12.

Figure 5:
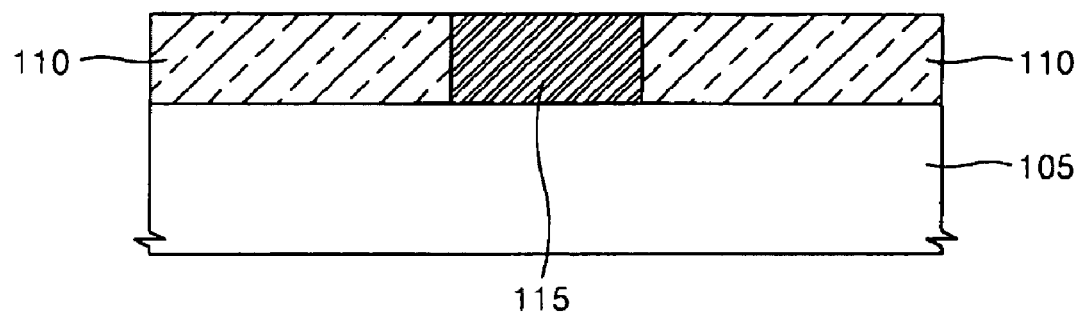
FIG. 5 through FIG. 9, FIG. 11, FIG. 12 and FIG. 14 are cross-sectional views illustrating methods of fabricating a non-volatile memory device according to an embodiment of the present invention.

Referring to FIG. 5, a first doped layer 115 of a first conductivity type is formed on a substrate 105. For example, the first doped layer 115 is defined by forming a device isolation layer 110 having a shallow trench isolation structure on the substrate 105. After or before forming the device isolation layer 110, the first doped layer 115 may be doped with high concentration impurities of the first conductivity type.

In another embodiment of the present invention, the first doped layer 115 may be formed by using an epitaxial deposition method. For example, the device isolation layer 110 may be formed on the substrate 105, and the first doped layer 115 may be grown from the surface of the substrate 105 exposed by the device isolation layer 110. After or before forming the first doped layer 115, the first doped layer 115 may be doped with high concentration impurities of the first conductivity type.

Figure 6:
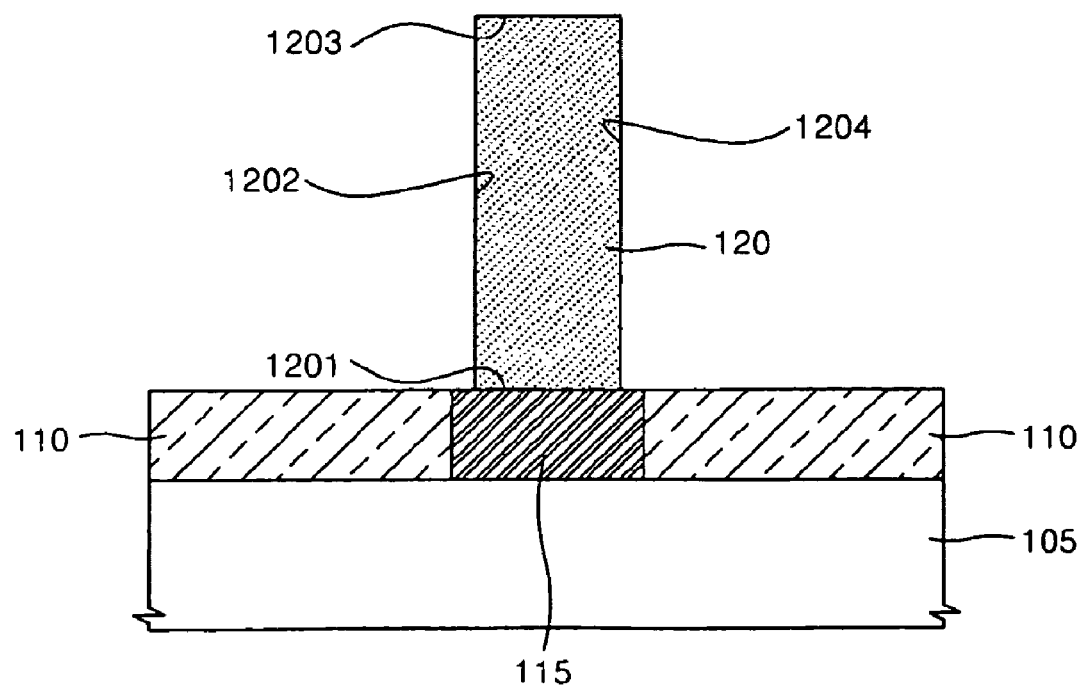

Referring to FIG. 6, a semiconductor pillar 120 of a second conductivity type may extend upward from the substrate 105. For example, the semiconductor pillar 120 may be formed by using an epitaxial deposition method on the first doped layer 115. The semiconductor pillar 120 may be doped with low concentration impurities of the second conductivity type at substantially the same time or after the semiconductor pillar 120 is formed.

If an epitaxial deposition method is used, the semiconductor pillar 120 may not be grown from the device isolation layer 110, and may be optionally grown from the first doped layer 115. However, even when an epitaxial deposition method is used, since the semiconductor pillar 120 can grow laterally, the semiconductor pillar 120 may have a radial structure in which the diameter or width increases as the height of the semiconductor pillar 120 increases above the substrate 105. However, by controlling deposition conditions, the shape of the semiconductor pillar 120 may vary.

In some embodiments, the semiconductor pillar 120 may be grown as a nano-wire structure of a semiconductor material by using a molecular beam epitaxy (MBE) method or an ultra-high vacuum chemical vapor deposition (UHVCVD) method.

Figure 7:
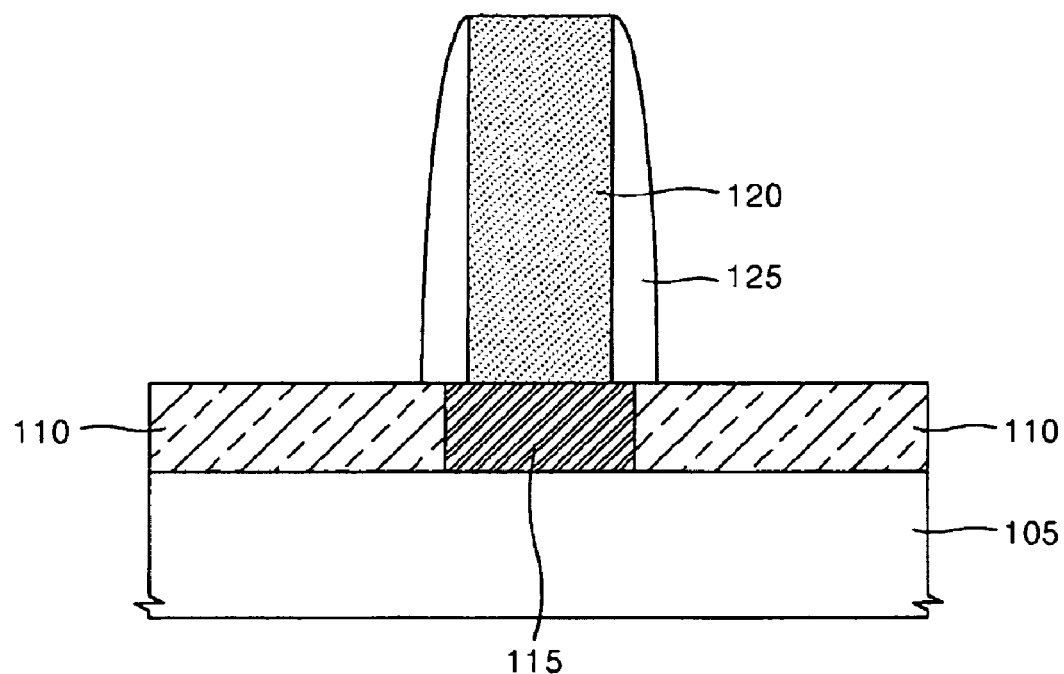

Referring to FIG. 7, a spacer insulating layer 125 may be formed on a sidewall of the semiconductor pillar 120. For example, a spacer insulating layer 125 may be formed by thermally oxidizing the sidewall of the semiconductor pillar 120. As another example, the spacer insulating layer 125 may be formed by forming an oxide layer or a nitride layer on the sidewall of the semiconductor pillar 120, and then by anisotropically etching the layer. The spacer insulating layer 125 may surround the substantially entire sidewall of the semiconductor pillar 120.

Figure 8:
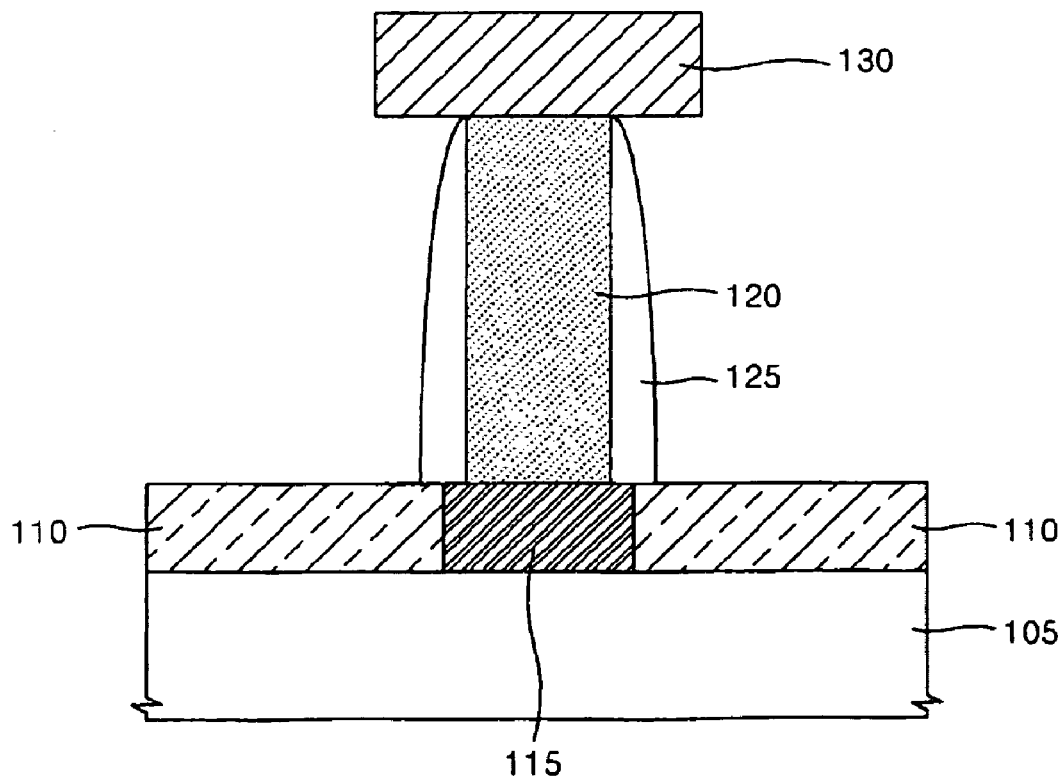

Referring to FIG. 8, a second doped layer 130 of the first conductivity type may be formed on the semiconductor pillar 120. A top surface 1203 of the semiconductor pillar 120 may be electrically connected to the second doped layer 130. For example, the second doped layer 130 may be grown from the semiconductor pillar 120 by using an epitaxial deposition method. The spacer insulating layer 125 can prevent the second doped layer 130 from growing on the sidewall of the semiconductor pillar 120. The second doped layer 130 may be doped with high concentration impurities of the first conductivity type at the same time or after the second doped layer 130 is formed.

The second doped layer 130 may cover a top surface 1203 of the semiconductor pillar 120. A width or diameter of the second doped layer 130 may increase in a direction from the top surface 1203 of the semiconductor pillar 120 toward the top surface of the second doped layer 130. Accordingly, the width or diameter of the second doped layer 130 may be greater than those of the semiconductor pillar 120 and the first doped layer 115.

Figure 9:
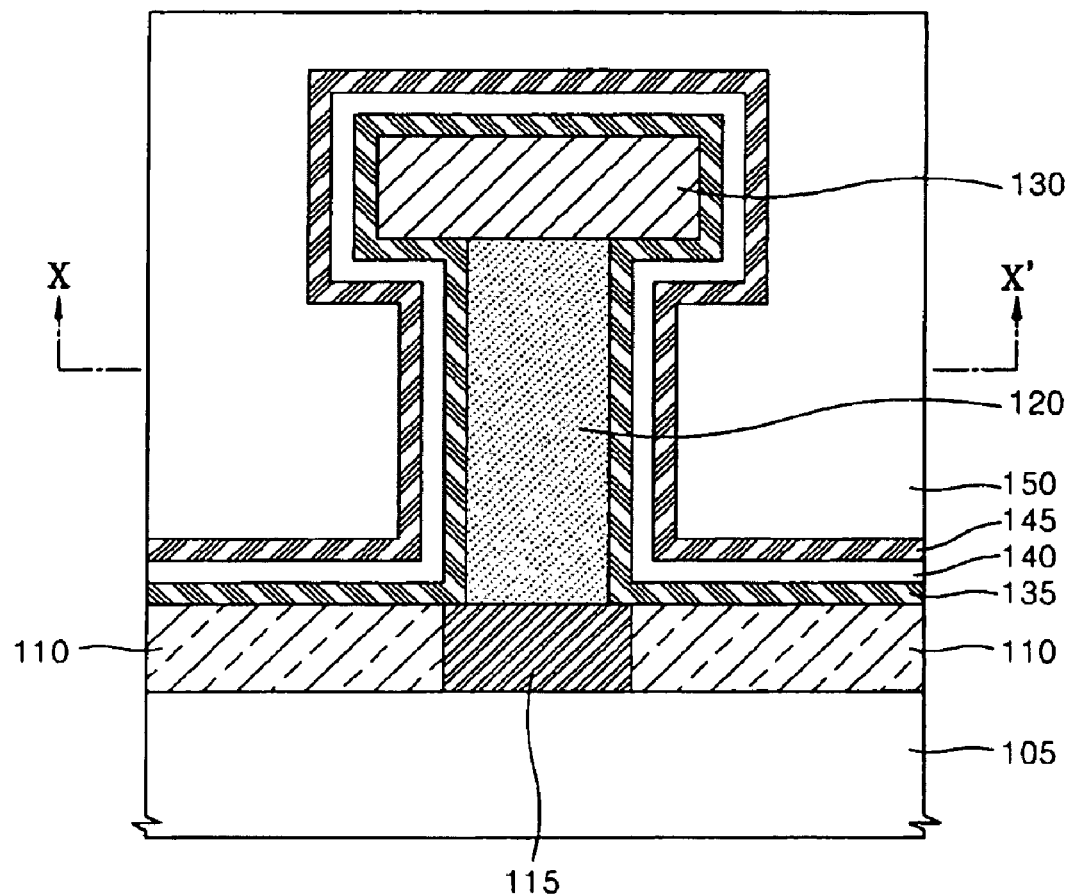
Figure 10:
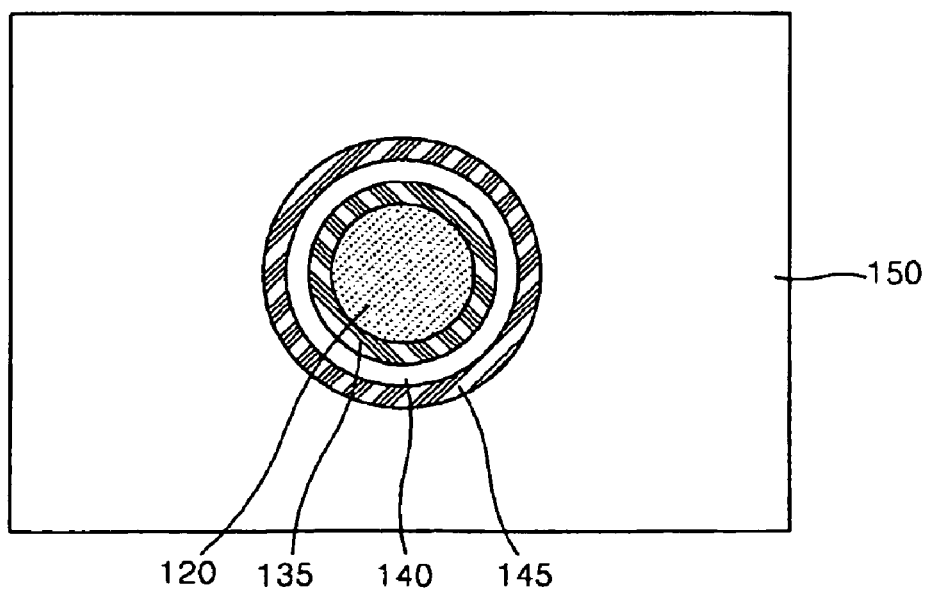
FIG. 10 is a cross-sectional view taken along line X-X' of FIG. 9.

Referring to FIG. 9 and FIG. 10, a tunneling insulating layer 135, a charge storage layer 140, a blocking insulating layer 145 and a control gate electrode layer 150 may be sequentially formed so as to surround the second doped layer 130 and the semiconductor pillar 120. For example, each of the tunneling insulating layer 135 and the blocking insulating layer 145 may include an oxide layer, a nitride layer, or a high-k dielectric layer. The charge storage layer 140 may be a nitride layer, charge-trapping dots, or nano-crystals, which are all capable of trapping charges. The control gate electrode layer 150 may include a conductive material, for example, polysilicon, metal, or metal silicide.

In the present embodiment, the control gate electrode layer 150 may have a thickness sufficient to cover substantially all of the semiconductor pillar 120 and the second doped layer 130. However, in another embodiment of the present invention, the control gate electrode layer 150 may have an appropriate thickness to surround only the semiconductor pillar 120 or a portion of the semiconductor pillar 120.

Figure 11:
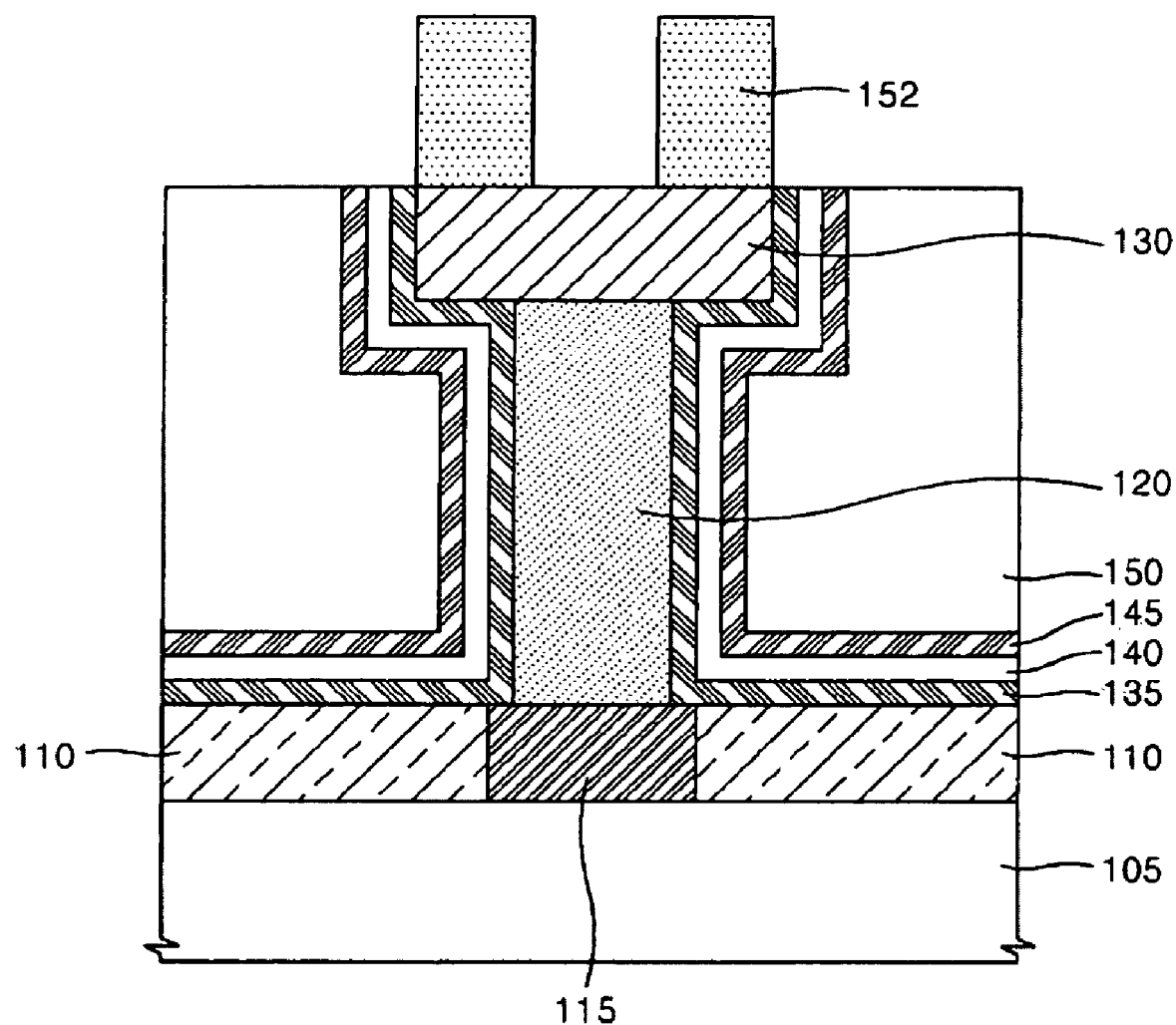

Referring to FIG. 11, the tunneling insulating layer 135, the charge storage layer 140, the blocking insulating layer 145 and the control gate electrode layer 150 may be planarized to expose the second doped layer 130. For example, an etch back method or a chemical mechanical polishing (CMP) method may be used for planarizing.

Then, a portion of the second doped layer 130, for example, a center portion of the second doped layer 130, may be exposed by forming an etching mask layer 152 on the second doped layer 130. For example, the etching mask layer 152 may be formed in a line pattern so as to separate the tunneling insulating layer 135, the charge storage layer 140, the blocking insulating layer 145, and the control gate electrode layer 150.

Figure 12:
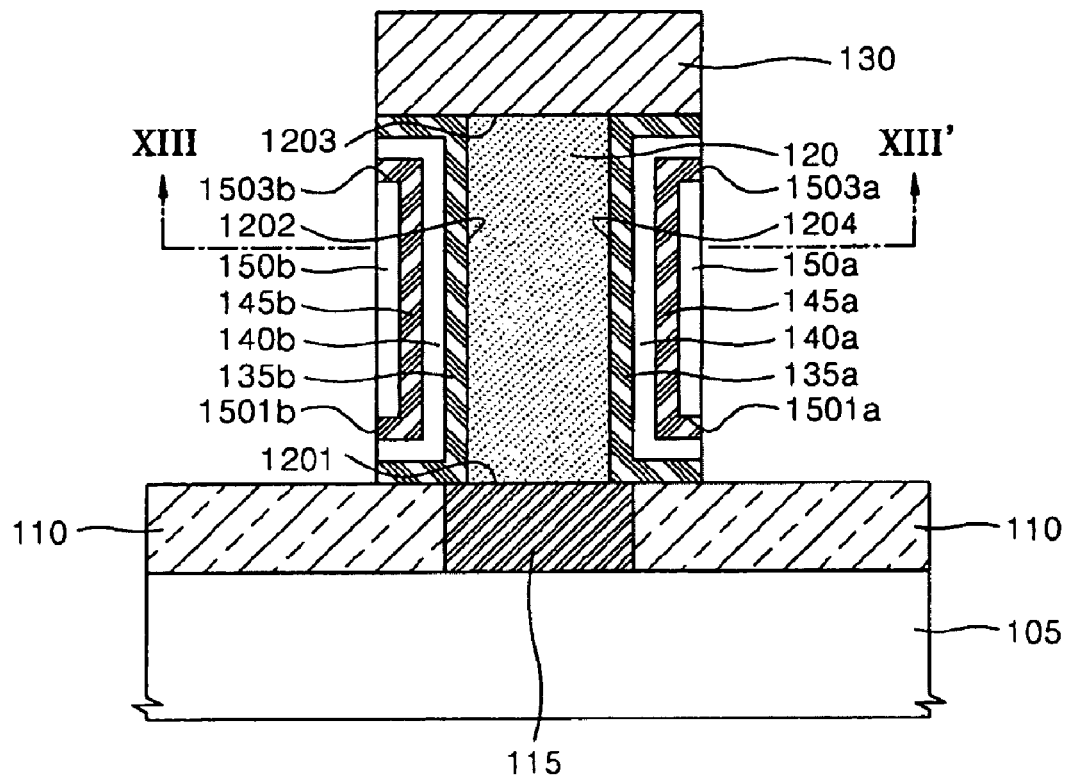
Figure 13:
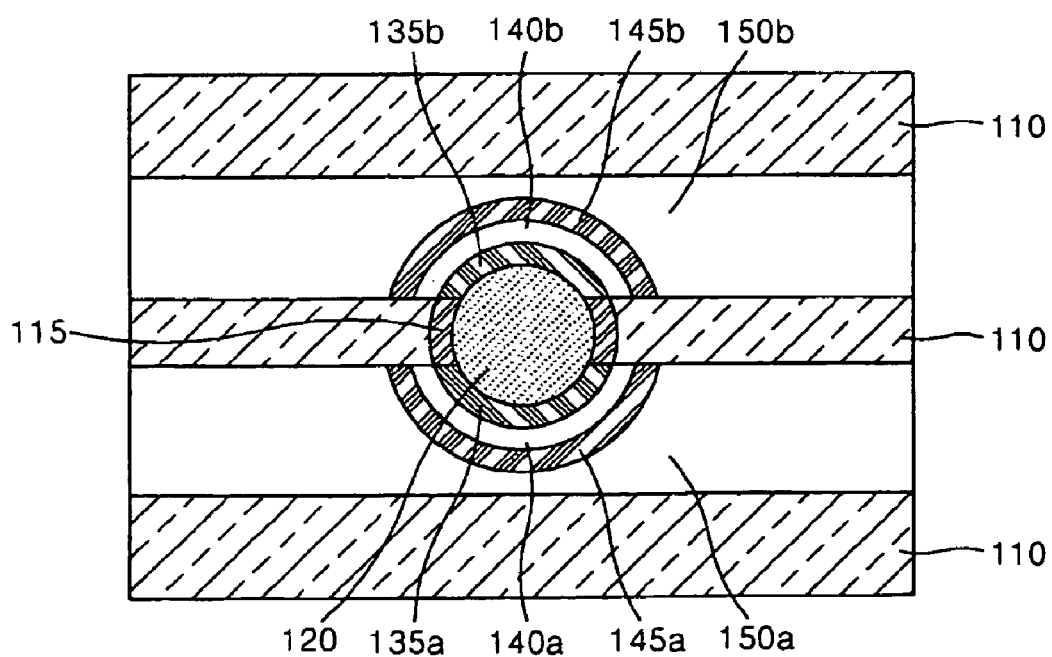
FIG. 13 is a cross-sectional view taken along line XIII-XIII' of FIG. 12.

Referring to FIG. 12 and FIG. 13, by etching the tunneling insulating layer 135, the charge storage layer 140, the blocking insulating layer 145 and the control gate electrode layer 150, which are exposed by the etching mask layer 152, the first and second tunneling insulating layers 135a and 135b, the first and second charge storage layers 140a and 140b, the first and second blocking insulating layers 145a and 145b, and the first and second control gate electrodes 150a and 150b may be formed so as to be separated from each other.

For example, the etching operation may include anisotropic etching and isotropic etching. First, portions exposed by the etching mask layer 152 are etched by using anisotropic etching. Then, lower portions below the second doped layer 130 may be etched by using isotropic etching. For example, the anisotropic etching may be plasma dry etching, and the isotropic etching may be chemical dry etching or wet etching. The first and second tunneling insulating layers 135a and 135b, the first and second charge storage layers 140a and 140b, the first and second blocking insulating layers 145a and 145b may be extended so as to cover top surfaces 1503a and 1503b and bottom surfaces 1501a and 1501b of the first and second control gate electrodes 150a and 150b below the second doped layer 130.

In another embodiment of the present invention, by controlling etching conditions and the shape of an etching mask, the first and second tunneling insulating layers 135a and 135b, the first and second charge storage layers 140a and 140b, the first and second blocking insulating layers 145a and 145b may be connected to each other, and the first and second control gate electrodes 150a and 150b may be also connected to each other.

Figure 14:
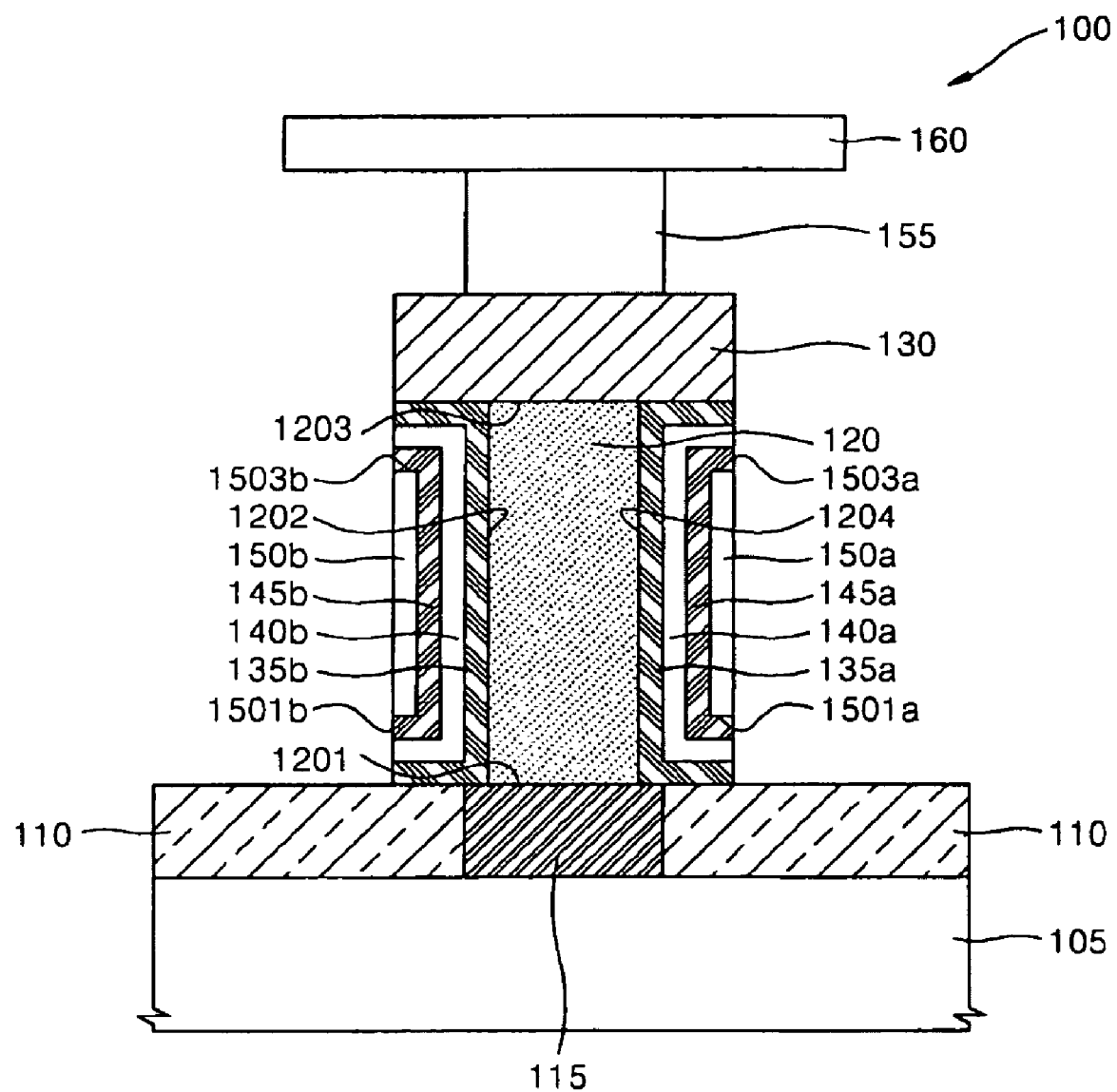

Referring to FIG. 14, a contact plug 155 may be formed on the second doped layer 130. Then, a bit line electrode 160 may be formed on the contact plug 155. The contact plug 155 and the bit line electrode 160 may include a conductive layer made of, for example, polysilicon, metal, or metal silicide.

Semiconductor packages 200a, 200b, 200c, and 200d according to embodiments of the present invention will now be described with reference to FIG. 15 through FIG. 18. A semiconductor chip 205 can include one of the non-volatile memory devices 100 and 100a of FIG. 1 through FIG. 4. Since the non-volatile memory devices 100 and 100a can process more than 2 bit data, the semiconductor packages 200a, 200b, 200c, and 200d can have a bit density more than twice that of a conventional semiconductor package of the same size.

Figure 15:
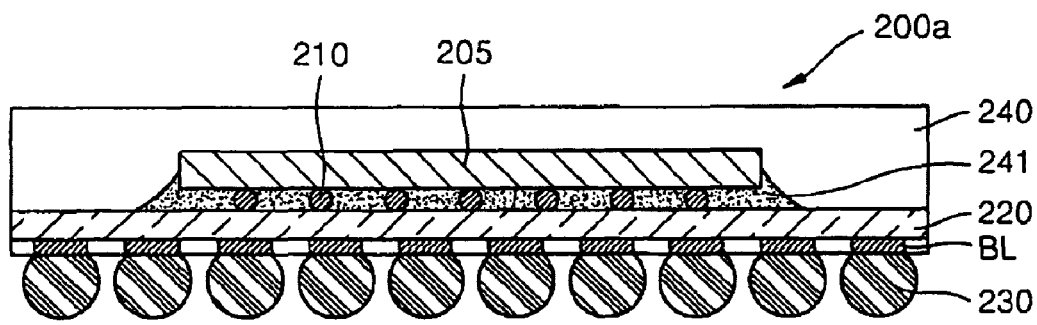
FIG. 15 through FIG. 18 are cross-sectional views illustrating semiconductor packages according to an embodiment of the present invention.

Referring to FIG. 15, the semiconductor chip 205 is attached to a substrate 220 using conductive bumps, or solder bumps, 210. At least one external connection terminal, or solder ball, 230 may be attached to a surface of the substrate 220 opposite to the semiconductor chip 205 via a ball land BL. The solder ball 230 is electrically connected to the semiconductor chip 205 and may act as an external terminal. A molding element or encapsulant 240 may be formed on the substrate 220 so as to cover the semiconductor chip 205. An underfill layer 241 is disposed under the semiconductor chip 241. The semiconductor package 200a thus forms a flip chip ball grid array (BGA) structure.

As another example, a wafer level package (WLP) can be manufactured by directly mounting the semiconductor chip 205 with the solder bumps 210 on a main board of an electronic device.

Figure 16:
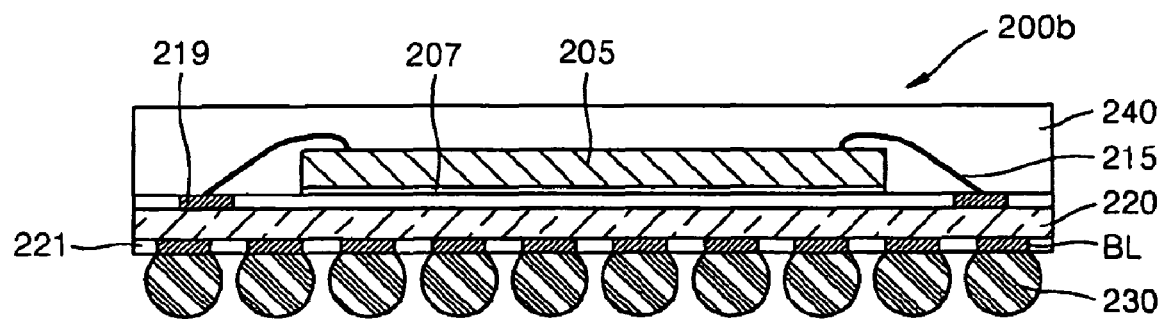

Referring to FIG. 16, the semiconductor chip 205 may be connected to a bond finger 219 of the substrate 220 by using, for example, a bonding wire 215. The semiconductor chip 205 may be attached to the substrate 220 using an adhesive 207. The solder balls 230 are connected to a surface of the substrate 220, opposite to the semiconductor chip 205. Thus, the semiconductor chip 205 may be electrically connected to the solder balls 230 via a ball land BL. The ball land BL is formed in a photo solder resist (PSR) 221. The semiconductor package 200b thus forms a BGA structure.

Figure 17:
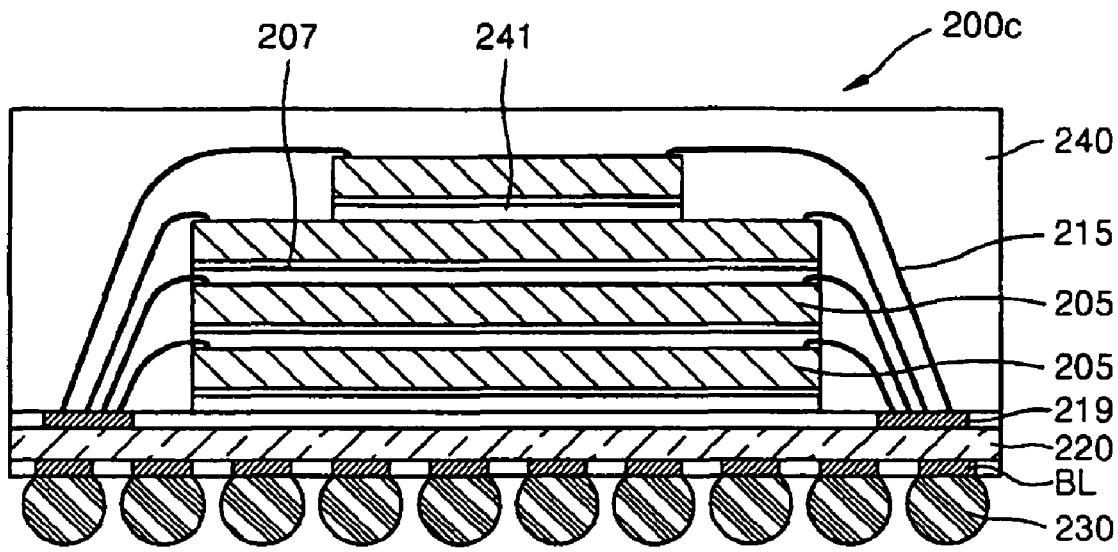

Referring to FIG. 17, a multi chip package (MCP) type semiconductor package 200c can be formed by stacking a plurality of semiconductor chips 205 on the substrate 220. The semiconductor chip 205 may be attached on the substrate 220 using a die attach film 207 or die attach paste 241 or both as shown. All of the semiconductor chips 205 may have the same structure or different structures from each other. For example, only some of the semiconductor chips 205 may have the same structure as the non-volatile memory devices 100 or 100a, and the others may have different structures.

Figure 18:
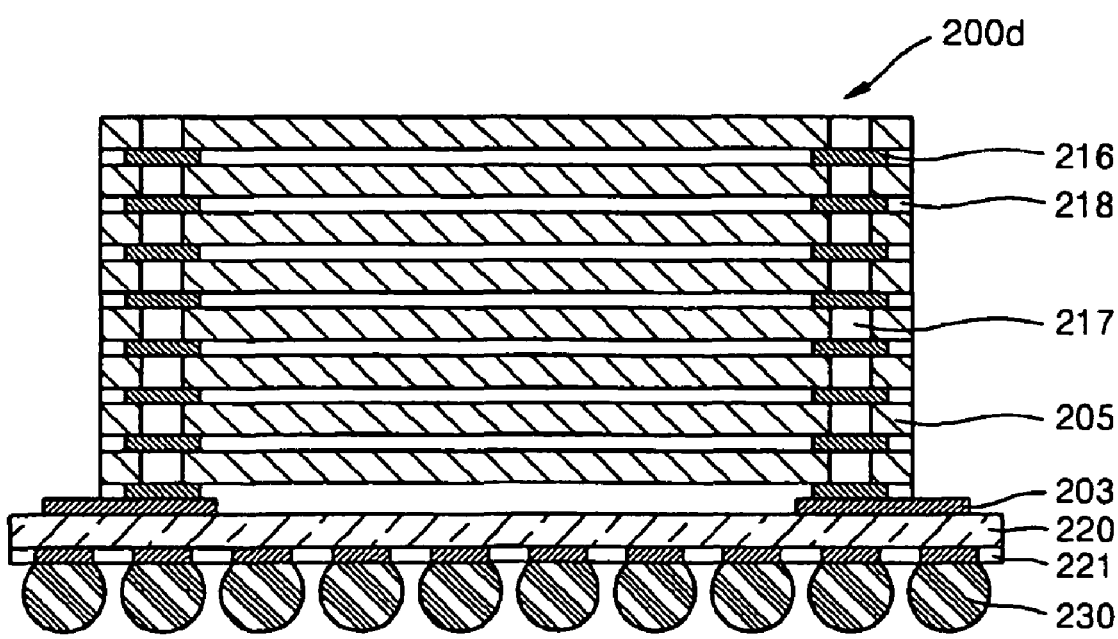

Referring to FIG. 18, a stacked semiconductor package 200d can be formed by stacking a plurality of semiconductor chips 205 via die attach paste 218 on the substrate 220 and forming a through-via 217 in the semiconductor chips 205. The semiconductor chips 205 can be electrically connected to the solder balls 230 via the substrate 220 through the through-via 217. The through-via 217 is electrically connected to a bump land 203 via a conductive pattern 216.

Figure 19:
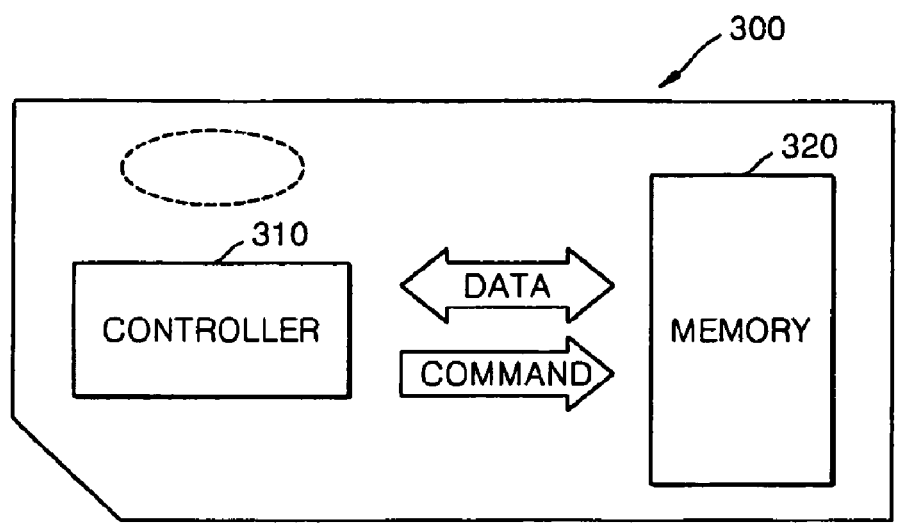
FIG. 19 is a schematic view illustrating a card according to an embodiment of the present invention.

FIG. 19 is a schematic view illustrating a card 300 according to an embodiment of the present invention.

Referring to FIG. 19, a controller 310 and a memory 320 may be disposed so as to exchange electrical signals with each other. For example, when a command is given from the controller 310, the memory 320 can transmit data. The memory 320 can include the non-volatile memory devices 100 or 100a of FIGS. 1 through 4. The card 300 can be used for a memory device such as a multi media card (MMC) or a secure digital (SD) card.

For example, the non-volatile memory devices 100 or 100a may be connected to a main board by using a wire bonding or a solder bump, or may be directly connected to the controller 310. As another example, the non-volatile memory devices 100 or 100a may be manufactured into one of the semiconductor packages 200a, 200b, 200c, and 200d described above or a similar form thereof, and may be mounted on the main board.

Figure 20:
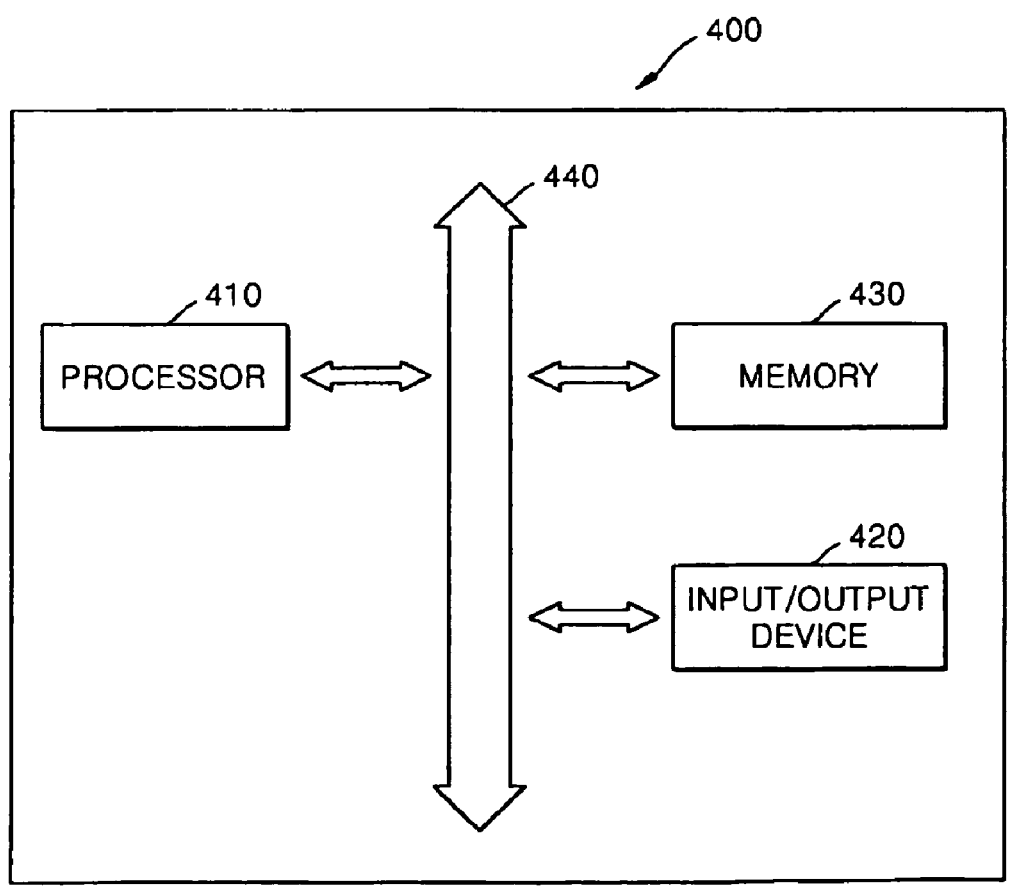
FIG. 20 is a schematic block diagram illustrating a system according to an embodiment of the present invention.

FIG. 20 is a schematic block diagram illustrating a system 400 according to an embodiment of the present invention.

Referring to FIG. 20, a processor 410, an input/output device 420, and a memory 430 may perform data communication by using a bus 440. The processor 410 may be used to program and control the system 400. The input/output device 420 may be used to input/output data of the system 400. The memory 430 may be one of the non-volatile memory devices 100 or 100a. Further, the memory 430 may store a code and data for operating the processor 410.

The system 400 may be connected to an external device, for example, a personal computer or a network, to exchange data with the external device.

As examples, the system 400 may be used for a mobile phone, an MP3 player, a navigation device, a solid-state disk (SSD) or a household appliance.

In a non-volatile memory device according to the present invention, a length of a channel can be easily extended by controlling a height of a semiconductor pillar. Furthermore, by decreasing a diameter or width of the semiconductor pillar, an integration density on a substrate can be increased. Accordingly, the non-volatile memory device can have high integration density and minimize a short channel effect.

Further, the non-volatile memory device according to the present invention can process at least 2 bit data by using a pair of control gate electrodes which are separated from each other.

Also, an area of a charge storage layer surrounding the non-volatile memory device of the present invention can be enlarged. Thus, properties related to data programming and retention can be improved, thereby increasing an operational reliability of the non-volatile memory device. Furthermore, a reliability of a multi-bit operation for performing data programming by locally separating a charge storage layer can be increased.

According to an aspect of the present invention, there is provided a non-volatile memory device. In the non-volatile memory device, a first doped layer of a first conductivity type is disposed on a substrate. A semiconductor pillar, of a second conductivity type opposite to the first conductivity type, extends upward from the first doped layer. A first control gate electrode substantially surrounds a first sidewall of the semiconductor pillar. A second control gate electrode substantially surrounds a second sidewall of the semiconductor pillar and is separated from the first control gate electrode. A second doped layer of the first conductivity type is disposed on the semiconductor pillar.

According to an aspect of the present invention, the first doped layer may be an epitaxial layer doped with first impurities on a portion of the substrate.

According to another aspect of the present invention, a first charge storage layer may be interposed between the semiconductor pillar and the first control gate electrode, and a second charge storage layer may be interposed between the semiconductor pillar and the second control gate electrode.

According to another aspect of the present invention, the first charge storage layer may extend so as to surround the first sidewall of the semiconductor pillar and cover top and bottom surfaces of the first control gate electrode, and the second charge storage layer may extend so as to surround the second sidewall of the semiconductor pillar and cover top and bottom surfaces of the second control gate electrode.

According to another aspect of the present invention, there is provided a method of fabricating a non-volatile memory device, wherein a first doped layer of a first conductivity type is formed on a substrate. A semiconductor pillar, of a second conductivity type opposite to the first conductivity type, is formed to extend upward from the first doped layer. A second doped layer of the first conductivity type is formed on the semiconductor pillar to be electrically connected to the semiconductor pillar. A first control gate electrode is formed to surround a first sidewall of the semiconductor pillar. A second control gate electrode separated from the first control gate electrode is formed to surround a second sidewall of the semiconductor pillar.

In an aspect of the method of fabricating a non-volatile memory device, the semiconductor pillar may have a nanowire structure.

In another aspect of the method of fabricating the non-volatile memory device, before forming the second doped layer, a spacer insulating layer surrounding a sidewall of the semiconductor pillar may be formed. After forming the second doped layer, the spacer insulating layer may be removed. The spacer insulating layer may be formed by thermally oxidizing a sidewall of the semiconductor pillar.

According to another aspect of the present invention, there is provided a semiconductor package having a semiconductor chip that is attached on a first side of a substrate and includes the non-volatile memory device. A plurality of solder balls are electrically connected to a second side of the substrate.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A non-volatile memory device comprising: a first doped layer of a first conductivity type disposed on a substrate; a semiconductor pillar of a second conductivity type opposite to the first conductivity type, wherein the semiconductor pillar extends upward from the first doped layer; a first control gate electrode disposed along a first sidewall of the semiconductor pillar; a second control gate electrode disposed along a second sidewall of the semiconductor pillar and separated from the first control gate electrode; and a second doped layer of the first conductivity type overlying the semiconductor pillar; a first charge storage layer interposed between the semiconductor pillar and the first control gate electrode; and a second charge storage layer interposed between the semiconductor pillar and the second control gate electrode, wherein: a width of the second doped layer is greater than a width of the semiconductor pillar, and a peripheral portion of the second doped layer protrudes past the first and second sidewalls of the semiconductor pillar, the first charge storage layer is conformally formed along a bottom surface of the peripheral portion of the second doped layer, the first sidewall of the semiconductor pillar, and the upper surface of the substrate, the second charge storage layer is conformally formed along a bottom surface of the peripheral portion of the second doped layer, the second sidewall of the semiconductor pillar, and the upper surface of the substrate, at least a portion of each of the first and second control gate electrodes is within an area, as viewed from a top down perspective, of the second doped layer, the first charge storage layer extends over and under respective top and bottom surfaces of the first control gate electrode, and the second charge storage layer extends over and under respective top and bottom surfaces of the second control gate electrode.

2. The non-volatile memory device of claim 1, wherein the first doped layer substantially surrounds a bottom surface of the semiconductor pillar.

3. The non-volatile memory device of claim 1, further comprising a device isolation layer formed on the substrate so as to substantially surround a sidewall of the first doped layer.

4. The non-volatile memory device of claim 1, wherein the first doped layer and the second doped layer are doped with first impurities at a high concentration and the semiconductor pillar is doped with second impurities at a low concentration.

5. The non-volatile memory device of claim 1, wherein the first doped layer is an epitaxial layer on the substrate.

6. The non-volatile memory device of claim 1, wherein a width of the second doped layer is greater than a width of the first doped layer.

7. The non-volatile memory device of claim 1, wherein the semiconductor pillar has a nano-wire structure.

8. The non-volatile memory device of claim 1, wherein the first charge storage layer and the second charge storage layer are connected to each other.

9. The non-volatile memory device of claim 1, wherein: the first charge storage layer extends so as to substantially surround the first sidewall of the semiconductor pillar; and the second charge storage layer extends so as to substantially surround the second sidewall of the semiconductor pillar.

10. The non-volatile memory device of claim 1, further comprising:
a first tunneling insulating layer interposed between the first charge storage layer and the semiconductor pillar;
a second tunneling insulating layer interposed between the second charge storage layer and the semiconductor pillar;
a first blocking insulating layer interposed between the first charge storage layer and the first control gate electrode; and
a second blocking insulating layer interposed between the second charge storage layer and the second control gate electrode.

11. The non-volatile memory device of claim 10, wherein the first tunneling insulating layer and the first blocking insulating layer extend so as to substantially surround the first sidewall of the semiconductor pillar and extend over and under respective top and bottom surfaces of the first control gate electrode; and the second tunneling insulating layer and the second blocking insulating layer extend so as to substantially surround the second sidewall of the semiconductor pillar and extend over and under respective top and bottom surfaces of the second control gate electrode.

12. The non-volatile memory device of claim 10, wherein the first tunneling insulating layer and the second tunneling insulating layer are connected to each other, and the first blocking insulating layer and the second blocking insulating layer are connected to each other.

13. The non-volatile memory device of claim 1, further comprising a bit line electrode electrically connected to the second doped layer.

14. The non-volatile memory device of claim 13, further comprising a contact plug disposed between the second doped layer and the bit line electrode.

15. The non-volatile memory device of claim 1, wherein the second doped layer overlies the first control gate electrode and the second control gate electrode.

16. The non-volatile memory device of claim 1, wherein a width of the second doped layer is substantially equal to a distance between an outer sidewall of the first control gate electrode and an outer sidewall of the second control gate electrode.

17. A semiconductor package comprising: a semiconductor chip disposed on a substrate, the semiconductor chip comprising a nonvolatile memory device including: a first doped layer of a first conductivity type; a semiconductor pillar of a second conductivity type opposite to the first conductivity type, wherein the semiconductor pillar extends upward from the first doped layer; a first control gate electrode disposed on along a first sidewall of the semiconductor pillar; a second control gate electrode disposed on along a second sidewall of the semiconductor pillar and separated from the first control gate electrode; and a second doped layer of the first conductivity type overlying the semiconductor pillar, a first charge storage layer interposed between the semiconductor pillar and the first control gate electrode; and a second charge storage layer interposed between the semiconductor pillar and the second control gate electrode, wherein: a width of the second doped layer is greater than a width of the semiconductor pillar, and a peripheral portion of the second doped layer protrudes past the first and second sidewalls of the semiconductor pillar, the first charge storage layer is conformally formed along a bottom surface of the peripheral portion of the second doped layer, the first sidewall of the semiconductor pillar, and the upper surface of the substrate, the second charge storage layer is conformally formed along a bottom surface of the peripheral portion of the second doped layer, the second sidewall of the semiconductor pillar, and the upper surface of the substrate at least a portion of each of the first and second control gate electrodes is within an area, as viewed from a top down perspective, of the second doped layer, the first charge storage layer extends over and under respective top and bottom surfaces of the first control gate electrode, and the second charge storage layer extends over and under respective top and bottom surfaces of the second control gate electrode; and at least one external terminal attached to a surface of the substrate opposite to the semiconductor chip and electrically connected to the semiconductor chip.

18. The semiconductor package of claim 17, further comprising a wire electrically connecting the semiconductor chip to the substrate.

19. The semiconductor package of claim 17, further comprising conductive bumps electrically connecting the semiconductor chip to the substrate.

20. The semiconductor package of claim 17, further comprising one or more additional semiconductor chips stacked on the substrate.

21. The semiconductor package of claim 20, further comprising a conductive via electrically connecting the semiconductor chip and the additional semiconductor chips to the substrate.

* * * * *